(12) United States Patent
Hasegawa et al.

(10) Patent No.: US 6,617,611 B2
(45) Date of Patent: Sep. 9, 2003

(54) DISPLAY UNIT AND METHOD OF FABRICATING THE SAME

(75) Inventors: Isao Hasegawa, Ogaki (JP); Hiroki Hamada, Hirakata (JP); Daisuke Ide, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/748,124

(22) Filed: Dec. 27, 2000

(65) Prior Publication Data

US 2001/0005607 A1 Jun. 28, 2001

(30) Foreign Application Priority Data

Dec. 27, 1999 (JP) .......................................... 11-371637
Feb. 28, 2000 (JP) ........................................ 2000-050734
Dec. 4, 2000 (JP) ....................................... 2000-368253

(51) Int. Cl.$^7$ ........................... H01L 29/10; H01L 31/20
(52) U.S. Cl. ....................................................... 257/59
(58) Field of Search ........................... 438/149; 349/49; 257/59

(56) References Cited

U.S. PATENT DOCUMENTS 4,268,539 A * 5/1981 Nakayama et al. .... 106/287.18
6,171,663 B1 * 1/2001 Hanada et al. .............. 349/139

FOREIGN PATENT DOCUMENTS

JP         8-152651         6/1996

OTHER PUBLICATIONS

Zhang et al., "New gallium and indium based fluoride glasses" Journal of Non–Crystalline Solids, Jan. 1997, Elsevier Press, vol. 213–214, pp. 6–10.*

"Highly Reliable Poly–Si TFT LCD Light–Valves with ITO Pixel–Electrodes Stabilized by CF4 Plasma–Treatment Process," by Hasegawa et al., AM–LCR 2000: Digest of Technical Papers (Jul. 12–14, 2000), pp. 17–20.

"Multicolor Pixel Patterning of Light–Emitting Polymers by Ink–Jet Printing", by Shimoda et al., Society for Information Display, International Symposium Digest of Technical Papers, vol. XXX (May 18–20, 1999), pp. 376–379.

* cited by examiner

*Primary Examiner*—William David Coleman
(74) *Attorney, Agent, or Firm*—McDermott, Will & Emery (57) ABSTRACT

A display unit capable of inhibiting moisture and gas from penetrating into a liquid crystal layer and an alignment layer also after formation of a display electrode and suppressing decomposition of a material forming the display electrode is obtained. In this display unit, an impurity-introduced layer containing an impurity element having high electronegativity is formed on the surface of an insulator film and the surface of the display electrode after formation of the display electrode. Thus, the insulator film and the display electrode are improved in effects of preventing transmission of moisture and gas also after formation of the display electrode. The impurity-introduced layer formed on the surface of the display electrode stabilizes the surface of an ITO film forming the display electrode, thereby suppressing decomposition of the ITO film.

16 Claims, 6 Drawing Sheets

DISPLAY UNIT AND METHOD OF FABRICATING THE SAME

BACKGROUND OF THE INVENTION

1. Field of the Invention

The present invention relates to a display unit and a method of fabricating the same, and more particularly, it relates to a display unit having a display electrode formed on an insulator film and a method of fabricating the same.

2. Description of the Prior Art

Figure 10:
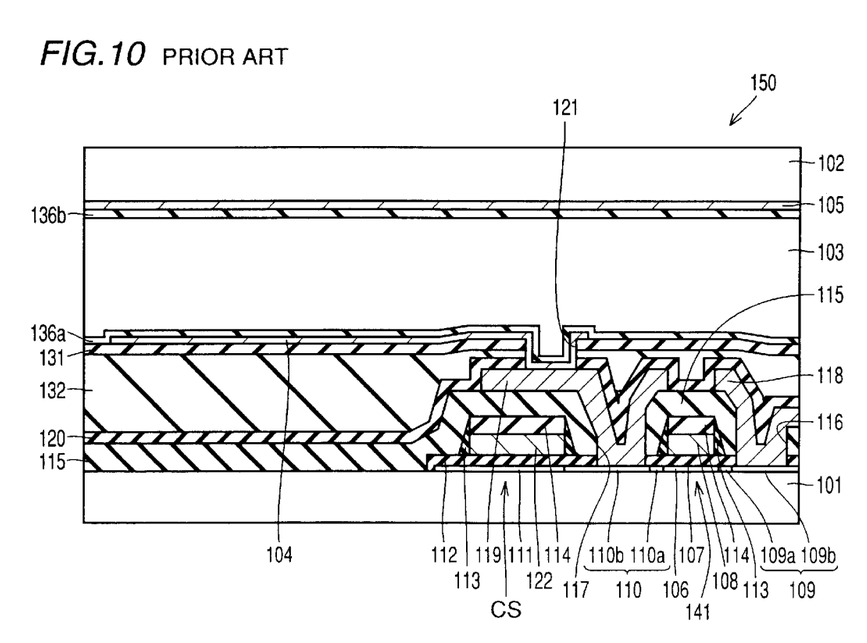
FIG. 10 is a sectional view showing a pixel part of a conventional liquid crystal display unit.

A transmission liquid crystal display unit employing a polycrystalline silicon TFT is known in general. For example, Japanese Patent Laying-Open No. 8-152651 (1996) discloses such a transmission liquid crystal display unit. FIG. 10 is a sectional view showing a pixel part 150 of the conventional transmission liquid crystal display unit disclosed in the aforementioned gazette. The structure of the pixel part 150 in the conventional transmission liquid crystal display unit is now described with reference to FIG. 10.

In the pixel part 150 of the conventional transmission liquid crystal display unit, a liquid crystal layer 103 filled with liquid crystals is formed between opposed transparent insulating substrates 101 and 102. The transparent insulating substrate 101 is provided with a display electrode 104 of a liquid crystal cell. The transparent insulating, substrate 102 is provided with a common electrode 105 of the liquid crystal cell. The display electrode 104 and the common electrode 105 are opposed to each other through the liquid crystal layer 103. An alignment layer 136a is provided between the liquid crystal layer 103 and the display electrode 105, while another alignment layer 136b is provided between the liquid crystal layer 103 and the common electrode 105.

A polycrystalline silicon film 106 defining an active layer of a TFT 141 is formed on the surface of the transparent insulating substrate 101 closer to the liquid crystal layer 103. A gate insulator film 107 is formed on the polycrystalline silicon film 106. A gate electrode 108 is formed on the gate insulator film 107. A drain region 109 and a source region 110 of an LDD structure are formed on the polycrystalline silicon film 106. The drain region 109 of the LDD structure is formed by a low concentration region 109a and a high concentration region 109b. The source region 110 of the LDD structure is formed by a low concentration region 110a and a high concentration region 110b. The drain region 109 and the source region 110 of the LDD structure and the gate electrode 108 form the TFT 141.

The transparent insulating substrate 101 is provided on a portion adjacent to the TFT 141 with an auxiliary capacitor CS formed through the same step as that for forming the TFT 141. A storage electrode 111 of the auxiliary capacitor CS is formed in the polycrystalline silicon film 106 and connected with the source region 110 of the TFT 141. A dielectric film 112 is formed on the storage electrode 111. A counter electrode 122 of the auxiliary capacitor CS is formed on the dielectric film 112. The dielectric film 112, located on an extension of the gate insulator film 107, is identical in structure to the gate insulator film 107 and formed through the same step as that for forming the gate insulator film 107. The counter electrode 122 is identical in structure to the gate electrode 108 and formed through the same step as that for forming the gate electrode 108. Side wall insulator films 113 are formed on the side walls of the counter electrode 122 and the gate electrode 108. Insulator films 114 are formed on the counter electrode 122 and the gate electrode 108.

An interlayer isolation film 115 is formed on the overall surfaces of the TFT 141 and the auxiliary capacitor CS. The high concentration region 110b forming the source region 110 is connected to a source electrode 119 through a contact hole 117 formed in the interlayer isolation film 115. The high concentration region 109b forming the drain region 109 is connected to a drain electrode 118 forming a drain wire through a contact hole 116. An insulator film 120, an SOG film 132 serving as a planarization film and another insulator film 131 are formed on the overall surface of the device including the interlayer isolation film 115, the drain electrode 118 and the source electrode 119. The SOG film 132 serving as the planarization film is held between the insulator films 120 and 131. The display electrode 104 is formed on the insulator film 131.

The display electrode 104 is connected with the source electrode 119 through a contact hole 121 formed in the insulator film 120, the SOG film 132 and the insulator film 131. The aforementioned SOG film 132 fills up steps formed on ends of the auxiliary capacitor CS thereby flattening the surface of the display electrode 104. An aluminum alloy is generally employed as the material for the drain electrode 118 and the source electrode 119. Further, an ITO (indium tin oxide) film is generally employed as the material for the display electrode 104. The display electrode 104, the drain electrode 118 and the source electrode 119 are generally formed by sputtering.

In the aforementioned structure, the SOG film 132 serving as the planarization film is provided for the following reason: If large steps are caused on the display electrode 104, liquid crystal molecules cannot be homogeneously oriented in portions of the liquid crystal layer 103 located on the steps. When the liquid crystal molecules are heterogeneously oriented in the liquid crystal layer 103, the display electrode 104 cannot control light transmission and light interception of the liquid crystal layer 103, leading to a regular light transmission state. In this case, the contrast is lowered on the step portions regularly in the light transmission state. In the step portions, further, the thickness of the display electrode 104 is so reduced that the resistance value of the display electrode 104 is increased or the display electrode 104 is disadvantageously disconnected. In order to flatten the surface of the display electrode 104, therefore, the SOG film 132 is provided between the display electrode 104 and the insulator film 131 as the planarization film.

The term "SOG (spin on glass) film 132" generically indicates a film mainly composed of a silicon dioxide formed from a solution prepared by dissolving a silicon compound in an organic solvent. Spin coating is employed for applying the SOG film 132. More specifically, the solution prepared by dissolving the silicon compound in the organic solvent is dripped on a substrate while rotating the substrate. Thus, a coating of the solution is formed thickly on concave portions of steps defined on the substrate due to wiring and thinly on convex, to relax the steps. Consequently, the surface of the coating of the solution is flattened. Then, heat treatment is performed for evaporating the organic solvent and progressing polymerization, thereby forming the SOG film 132 having a flat surface.

The SOG film 132 includes an inorganic SOG film containing no organic component in the silicon compound as expressed in the following general formula (1) and an organic SOG film containing an organic component in the silicon compound as expressed in the following general formula (2):

$$[SiO_2]_n \qquad (1)$$

$$[R_xSiO_Y]_n \quad (2)$$

where n, X and Y represent integers, and R represents an organic group such as an alkyl group or an aryl group.

The inorganic SOG film contains large quantities of moisture and hydroxyl groups, has high hygroscopicity, is fragile as compared with a silicon oxide film formed by CVD (chemical vapor deposition), and readily cracked in heat treatment when its thickness is in excess of 0.5 μm.

On the other hand, the organic SOG film has portions where bonds are closed with alkyl groups or aryl groups and is hence inhibited from cracking in heat treatment, and its thickness can be set to about 0.5 to 1 μm. When employing the organic SOG film, therefore, an interlayer isolation film having a large thickness can be obtained and large steps defined on the substrate can be sufficiently flattened. However, the organic SOG film also contains moisture and hydroxyl groups although the quantities thereof are small as compared with the inorganic SOG film, and has high hygroscopicity.

Thus, the SOG film 132 serving as the planarization film contains moisture and hydroxyl groups, and has high hygroscopicity. The SOG film 132 partially discharges the moisture and hydroxyl groups contained therein due to temperature change or pressure change.

A photosensitive resin insulator film or another coating resin insulator film (a polyimide resin film, an acrylic resin film, an epoxy resin film or the like) can also be employed as the planarization film.

However, the resin insulator film or the organic SOG film, having organic groups in its components, discharges organic gas such as methane due to temperature change or pressure change.

Moisture, hydroxyl groups and organic gas discharged from the planarization film deteriorate the alignment layer 136a and the liquid crystal layer 103 or form bubbles in the liquid crystal layer 103 to cause defective display.

In order to prevent such inconvenience, there is a method of forming a film having a properly transmitting neither hydroxyl groups nor gas and performing treatment for suppressing transmission on the film.

Japanese Patent Laying-Open 8-152651 disclosing the aforementioned conventional structure describes a technique of forming the insulator film 131 on the SOG film 132 by plasma CVD and thereafter performing treatment for improving (modifying) the property of suppressing transmission of moisture and gas on the insulator film 131. This gazette also describes that a silicon oxide film, a silicon nitride film or a silicon oxynitride film is employed as the insulator film 131 and the treatment for modification may be performed by one of the following two methods:

In the first method, ions are implanted into the surface of the insulator film 131 formed by a plasma TEOS film or a plasma oxide film. The implanted ions are prepared from silicon ions, inert gas ions, arsenic ions, phosphorus ions or the like. In the second method, treatment with hydrogen plasma is performed on the surface of the insulator film 131 formed by a plasma TEOS film or a plasma oxide film.

However, the aforementioned method of modifying the conventional liquid display unit has the following problems: When forming the display electrode 104 of ITO, an ITO film must be formed on the overall surface of the insulator film 131 to be thereafter patterned into a desired shape by etching. In this case, the surface of the insulator film 131 is removed or damaged due to the etching for forming the display electrode 104 although the insulator film 131 is modified, and the effect of modifying the surface of the insulator film 131 is disadvantageously lost as a result.

Therefore, it is difficult to solve such inconvenience that moisture or the like contained in the SOG film 132 is transmitted through the insulator film 131 to deteriorate the alignment layer 136a and the liquid crystal layer 103 or forms bubbles in the liquid crystal layer 103 to cause defective display after formation of the display electrode 104.

Figure 11:
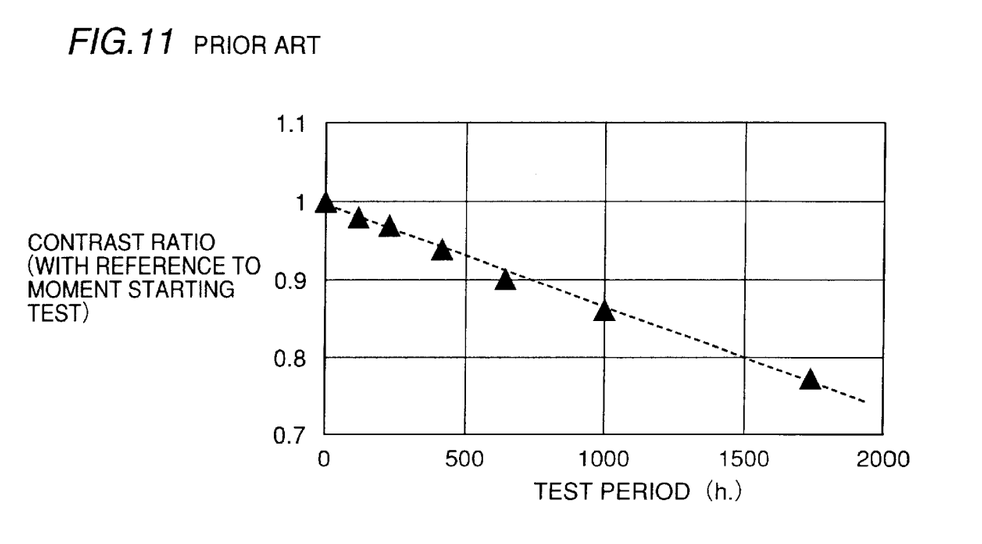
FIG. 11 illustrates results of an aging test on the conventional liquid crystal display unit shown in FIG. 10.

Deterioration of the alignment layer 136a conceivably also results from decomposition of the ITO film forming the display electrode 104. More specifically, the ITO film forming the display electrode 104 is decomposed to form indium and oxygen. Such indium and oxygen conceivably adhere to the surface of the alignment layer 136a, to deteriorate the alignment layer 136a. FIG. 11 shows a contrast ratio at the time of performing an aging test on the conventional liquid crystal display unit employing an ITO film as the display electrode 104. As shown in FIG. 11, the alignment layer 136a is deteriorated with time to disadvantageously reduce the contrast in the prior art.

SUMMARY OF THE INVENTION

An object of the present invention is to provide a display unit capable of preventing moisture and gas from penetrating into a liquid crystal layer and an alignment layer also after forming a display electrode and suppressing decomposition of materials forming the display electrode.

Another object of the present invention is to provide a display unit capable of suppressing decomposition of materials forming a display electrode thereby preventing deterioration of an alignment layer.

Still another object of the present invention is to provide a method of fabricating a display unit capable of preventing moisture and gas from penetrating into a liquid crystal layer and an alignment layer from a substrate through an insulator film without losing an effect of the insulator film preventing transmission of moisture and gas during fabrication steps.

A further object of the present invention is to provide a method of fabricating a display unit capable of preventing deterioration of an alignment layer by suppressing decomposition of elements forming a display electrode.

A display unit according to an aspect of the present invention comprises an insulator film formed on a substrate, a display electrode formed on the insulator film and an impurity-introduced layer, formed on the surface of the display electrode and the surface of the insulator film, containing an impurity element having high electronegativity. Examples of the element having high electronegativity are fluorine, oxygen, nitrogen, chlorine, bromine, carbon, sulfur, iodine, serene, hydrogen, phosphorus, tellurium, boron and arsenic. When the insulator film is a silicon oxide film, a silicon nitride film or a silicon oxynitride film, the impurity element having high electronegativity is preferably prepared from fluorine, chlorine, bromine, carbon, sulfur, iodine, serene, hydrogen, phosphorus, tellurium, boron or arsenic.

In the display unit according to the aforementioned aspect, the impurity-introduced layer containing the impurity element having high electronegativity is provided on the surface of the display electrode and the surface of the insulator film thereby improving effects of the insulator film and the display electrode preventing transmission of moisture and gas also after forming the display electrode. Thus, the substrate can be prevented from discharging moisture and gas toward a liquid crystal layer and an alignment layer also after forming the display electrode. Consequently, the liquid crystal layer and the alignment layer ca be effectively prevented from deterioration and defective display resulting from moisture and gas. Further, the surface of an ITO film forming the display electrode is stabilized by forming the impurity-introduced layer containing the impurity having high electronegativity on the surface of the display electrode, whereby the ITO film is inhibited from decomposition. Consequently, the alignment layer can be inhibited from deterioration conceivably resulting from decomposition of the ITO film forming the display electrode. Thus, an excellent contrast can be maintained over a long period.

In the display unit according to the aforementioned aspect, the insulator film preferably includes an insulator film containing an organic component. Thus, the insulator film can be effectively prevented from cracking.

In the display unit according to the aforementioned aspect, the impurity element having high electronegativity preferably includes fluorine. When employing fluorine having the highest electronegativity, the ratio capable of terminating dangling bonds or weak bonds of the insulator film with fluorine is increased when forming the impurity-introduced layer by fluorinating the insulator film and the display electrode while the ITO film forming the display film readily reacts with fluorine. Thus, the effects of the insulator film and the display electrode preventing transmission of moisture and gas can be further improved while the alignment layer can be inhibited from deterioration conceivably resulting from decomposition of the ITO film forming the display electrode. In this case, the impurity-introduced layer is preferably formed on the surface of the insulator film, and preferably includes any of a fluoride layer of a silicon oxide film, a fluoride layer of a silicon nitride film and a fluoride layer of a silicon oxynitride film.

In this case, the impurity-introduced layer preferably includes a first layer, formed on the surface of the display electrode, mainly composed of indium fluoride. Thus, the first layer mainly composed of indium fluoride stabilizes the surface of the ITO film forming the display electrode, thereby suppressing decomposition of the ITO film. Consequently, the alignment layer can be inhibited from deterioration conceivably resulting from decomposition of the ITO film forming the display electrode. Further, the first layer improves the effect of the display electrode preventing transmission of moisture and gas, to be capable of preventing the alignment layer formed on the display film from deterioration resulting from moisture and gas. In this case, the display unit preferably further comprises a second layer, formed on the first layer, mainly composed of carbon fluoride. Thus, the first and second layers can further suppress deterioration of the alignment layer conceivably resulting from decomposition of the ITO film forming the display electrode while further suppressing deterioration of the alignment layer formed on the display electrode resulting from moisture and gas.

A display unit according to another aspect of the present invention comprises an insulator film formed on a substrate, a display electrode formed on the insulator film and a first layer, formed on the surface of the display electrode, mainly composed of indium fluoride.

In the display unit according to the aforementioned aspect, the first layer mainly composed of indium fluoride is provided on the surface of the display electrode thereby stabilizing the surface of an ITO film forming the display electrode, for suppressing decomposition of the ITO film. Consequently, an alignment layer can be inhibited from deterioration conceivably resulting from decomposition of the ITO film forming the display electrode. Further, the first layer improves an effect of the display electrode preventing transmission of moisture and gas, whereby the alignment layer formed on the display electrode can be prevented from deterioration resulting from moisture and gas. Thus, an excellent contract can be maintained over a long period.

The display unit according to the aforementioned aspect preferably further comprises a second layer, formed on the first layer, mainly composed of carbon fluoride. Thus, the first and second layers can further suppress deterioration of the alignment layer resulting from decomposition of the ITO film forming the display electrode while further suppressing deterioration of the alignment layer formed on the display electrode resulting from moisture and gas.

A method of fabricating a display unit according to still another aspect of the present invention comprises steps of forming an insulator film on a substrate, forming a display electrode on the insulator film and introducing an impurity element having high electronegativity into at least a portion of the insulator film not covered with the display electrode after formation of the display electrode.

In the method of fabricating a display unit according to the aforementioned aspect, the impurity element having high electronegativity is introduced into at least the portion of the insulator film not covered with the display electrode after forming the display electrode, thereby terminating dangling bonds in the surface of the insulator film with the impurity element having high electronegativity and replacing weak bonds in the surface of the insulator film with bonds with the impurity element having high electronegativity after forming the display electrode. Thus, a function of preventing transmission of moisture and gas is reinforced at least in the insulator film after formation of the display electrode. Consequently, the substrate can be effectively prevented from discharging moisture and gas toward a liquid crystal layer and an alignment layer after forming the display electrode. Thus, the liquid crystal layer and the alignment layer can be effectively prevented from deterioration and defective display resulting from moisture and gas. The impurity element having high electronegativity is introduced after forming the display electrode so that the surface of the insulator film containing the introduced impurity element having high electronegativity is not treated by etching for forming the display electrode or the like, whereby the effect of preventing transmission of gas is not lost in the surface of the insulator film.

In the method of fabricating a display unit according to the aforementioned aspect, the step of introducing the impurity element preferably includes a step of etching the surface of at least the portion of the insulator film not covered with the display electrode simultaneously with introduction of the impurity element. Thus, the effect of the insulator film preventing transmission of moisture and gas can be ensured. The surface of the insulator film is frequently damaged or suffers from adhesion of foreign matter in the process of forming the display electrode. If the degree of the damage or adhesion of foreign matter is high, introduction of the impurity element having high electronegativity is inhibited or a sufficient effect of preventing transmission cannot be attained. In this case, the surface of the insulator film is etched as described above so that the impurity element having high electronegativity can be introduced after removing damage or foreign matter, thereby ensuring the effect of the insulator film preventing transmission of moisture and gas.

In the method of fabricating a display unit according to the aforementioned aspect, the step of introducing the impurity element having high electronegativity preferably includes a step of exposing at least the portion of the insulator film not covered with the display electrode to plasma containing the impurity element having high electronegativity. Alternatively, the step of introducing the impurity element having high electronegativity preferably includes a step of exposing at least the portion of the insulator film not covered with the display electrode to a radical containing the impurity element having high electronegativity. When employing the plasma or radical in the aforementioned manner, the quantity of the introduced impurity element having high electronegativity and the speed for introducing the same can be effectively increased.

In the method of fabricating a display unit according to the aforementioned aspect, the step of introducing the impurity element having high electronegativity preferably includes a step of exposing at least the portion of the insulator film not covered with the display electrode to gas containing the impurity element having high electronegativity. Alternatively, the step of introducing the impurity element having high electronegativity preferably includes a step of exposing at least the portion of the insulator film not covered with the display electrode to liquid containing the impurity element having high electronegativity. When employing the gas or liquid in the aforementioned manner, the impurity element having high electronegativity can be introduced through a low-priced apparatus, whereby the fabrication cost can be reduced.

In the method of fabricating a display unit according to the aforementioned aspect, the step of introducing the impurity element having high electronegativity preferably includes a step of introducing ions containing the impurity element having high electronegativity into at least the portion of the insulator film not covered with the display electrode. When employing ion implantation, the quantity of the introduced impurity having high electronegativity and the depth of introduction thereof can be readily and precisely controlled.

In the method of fabricating a display unit according to the aforementioned aspect, the insulator film preferably includes an insulator film containing an organic component. When employing such an insulator film containing an organic component, cracking can be reduced.

In the method of fabricating a display unit according to the aforementioned aspect, the impurity element having high electronegativity preferably includes fluorine. When employing fluorine having the highest electronegativity, the ratio capable of terminating dangling bonds or weak bonds of the insulator film with fluorine is increased when forming an impurity-introduced layer by fluorinating the insulator film. Thus, the effect of the insulator film preventing transmission of moisture and gas can be further improved. In this case, the step of introducing the impurity element preferably includes a step of forming any of a fluoride layer of a silicon oxide film, a fluoride layer of a silicon nitride film and a fluoride layer of a silicon oxynitride film on the surface of the insulator film by introducing said impurity element.

In the method of fabricating a display unit according to the aforementioned aspect, the step of introducing the impurity element having high electronegativity preferably includes a step of introducing the impurity element having high electronegativity into both of the insulator film and the display electrode. In this case, the effects of preventing transmission of moisture and gas are improved in both of the insulator film and the display electrode. Thus, the substrate can be prevented from discharging moisture and gas toward a liquid crystal layer or an alignment layer. Consequently, the liquid crystal layer and the alignment layer can be effectively prevented from deterioration and defective display resulting from moisture and gas. The impurity element having high electronegativity is introduced into the display electrode for stabilizing the surface of an ITO film forming the display electrode, thereby suppressing decomposition of the ITO film. Consequently, the alignment layer can be inhibited from deterioration conceivably resulting from decomposition of the ITO film forming the display electrode.

In the method of fabricating a display unit according to the aforementioned aspect, the step of introducing the impurity element having high electronegativity preferably includes a step of fluorinating the display electrode thereby forming a first layer mainly composed of indium fluoride on the surface of the display electrode. Thus, the first layer mainly composed of indium fluoride stabilizes the surface of the ITO film forming the display electrode, thereby suppressing decomposition of the ITO film. Consequently, the alignment layer can be inhibited from deterioration conceivably resulting from decomposition of the ITO film forming the display electrode. Further, the first layer improves the effect of the display electrode preventing transmission of moisture and gas, thereby preventing the alignment layer formed on the display electrode from deterioration resulting from moisture and gas.

In this case, the step of fluorinating the display electrode preferably includes a step of forming the first layer mainly composed of indium fluoride on the surface of the display electrode while forming a second layer mainly composed of carbon fluoride on the first layer by exposing the surface of the display electrode to plasma containing fluorine and carbon. Thus, the first and second layers can further inhibit the alignment layer from deterioration conceivably resulting from decomposition of the ITO film forming the display electrode while further suppressing deterioration of the alignment layer formed on the display electrode resulting from moisture and gas.

The step of introducing the impurity element having high electronegativity may include a step of depositing a first layer mainly composed of indium fluoride on the display electrode by sputtering.

A method of fabricating a display unit according to a further aspect of the present invention comprises steps of forming an insulator film on a substrate, forming a display electrode on the insulator film and forming a layer containing fluorine on the surface of the display electrode.

In the method of fabricating a display unit according to the aforementioned aspect, the layer containing fluorine is formed on the surface of the display electrode for stabilizing the surface of an ITO film forming the display electrode with the layer containing fluorine, thereby suppressing decomposition of the ITO film. Consequently, an alignment layer can be inhibited from deterioration conceivably resulting from decomposition of the ITO film forming the display electrode. Further, the layer containing fluorine improves an effect of the display electrode preventing transmission of moisture and gas, thereby preventing the alignment layer formed on the display electrode from deterioration resulting from moisture and gas. Thus, an excellent contrast can be maintained over a long period.

In this case, the step of forming the layer containing fluorine preferably includes a step of forming a first layer mainly composed of indium fluoride on the surface of the display electrode while forming a second layer mainly composed of carbon fluoride on the first layer by exposing the surface of the display electrode to plasma containing fluorine and carbon. Thus, the first and second layers can further suppress deterioration of the alignment layer conceivably resulting from decomposition of the ITO film forming the display electrode while further suppressing deterioration of the alignment layer formed on the display electrode resulting from moisture and gas. The step of forming the layer containing fluorine may include a step of depositing a first layer mainly composed of indium fluoride on the display electrode by sputtering.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention is now described with reference to the drawings.

First, the structure of a pixel part 50 of a transmission liquid crystal display unit according to the embodiment of the present invention is described with reference to FIG. 1.

In the pixel part 50 of the transmission liquid crystal display unit according to this embodiment, a liquid crystal layer 3 filled with liquid crystals is formed between opposed transparent insulating substrates 1 and 2. The transparent insulating substrate 1 is provided with a display electrode 4 of a liquid crystal cell. The transparent insulating substrate 2 is provided with a common electrode 5 of the liquid crystal cell. The display electrode 4 and the common electrode 5 are opposed to each other through the liquid crystal layer 3. An alignment layer 36a is provided between the liquid crystal layer 3 and the display electrode 4, and another alignment layer 36b is provided between the liquid crystal layer 3 and the common electrode 5.

A polycrystalline silicon film 6 defining an active layer of a TFT 41 is formed on the surface of the transparent insulating substrate 1 closer to the liquid crystal layer 3. A gate insulator film 7 is formed on the polycrystalline silicon film 6. A gate electrode 8 is formed on the gate insulator film 7. A drain region 9 and a source region 10 of an LDD structure are formed on the polycrystalline silicon film 6. The drain region 9 of the LDD structure is formed by a low concentration region 9a and a high concentration region 9b. The source region 10 of the LDD structure is formed by a low concentration region 10a and a high concentration region 10b. The drain region 9 and the source region 10 of the LDD structure and the gate electrode 8 form the TFT 41.

The transparent insulating substrate 1 is provided on a portion adjacent to the TFT 41 with an auxiliary capacitor CS formed through the same step as that for forming the TFT 41. A storage electrode 11 of the auxiliary capacitor CS is formed on the polycrystalline silicon film 6 and connected with the source region 10 of the TFT 41. A dielectric film 12 is formed on the storage electrode 11. A counter electrode 22 of the auxiliary capacitor CS is formed on the dielectric film 12. The dielectric film 12 is located on an extension of the gate insulator film 7, is identical in structure to the gate insulator film 7, and formed through the same step as that for forming the gate insulator film 7. The counter electrode 22 is identical in structure to the gate electrode 8 and formed through the same step as that for forming the gate electrode 8. Side wall insulator films 13 are formed on the side walls of the counter electrode 22 and the gate electrode 8. An insulator film 14 is formed on the counter electrode 22 and the gate electrode 8.

An interlayer isolation film 15 is formed on the overall surfaces of the TFT 41 and the auxiliary capacitor CS. The high concentration region 10b forming the source region 10 is connected to a source electrode 19 through a contact hole 17 formed in the interlayer isolation film 15. The high concentration region 9b forming the drain region 9 is connected to a drain electrode 18 forming a drain wire through a contact hole 16. An insulator film 20, an SOG film 32 serving as a planarization film and another insulator film 31 are formed on the overall surface of the device including the interlayer isolation film 15, the drain electrode 18 and the source electrode 19. The SOG film 32 serving as the planarization film is held between the insulator films 20 and 31. The display electrode 4 of an ITO film is formed on the insulator film 31.

The display electrode 4 of an ITO film is connected with the source electrode 19 through a contact hole 21 formed in the insulator film 20, the SOG film 32 and the insulator film 31. The aforementioned SOG film 32 fills up step portions formed on ends of the auxiliary capacitor CS, thereby flattening the surface of the display electrode 4. An aluminum alloy is generally employed as the material for the drain electrode 18 and the source electrode 19.

According to this embodiment, a first layer 34 mainly composed of indium fluoride ($InF_x$) and a second layer 35 mainly composed of carbon fluoride ($CF_x$) are formed on the surface of the display electrode 4 after formation of the display electrode 4. After formation of the display electrode 4, further, a fluorine terminating layer 33 is formed on a portion of the surface of the insulator film 31 not covered with the display electrode 4. When the insulator film 31 is formed by a silicon oxide film, the fluorine terminating layer 33 is made of a fluoride (Si—F or Si—O—F) of the silicon oxide film. When the insulator film 31 is formed by a silicon nitride film, the fluorine terminating layer 33 is made of a fluoride (Si—F or Si—NF) of the silicon nitride film. When the insulator film 31 is formed by a silicon oxynitride film, the fluorine terminating layer 33 is made of a fluoride (Si—F, Si—O—F or Si—N—F) of the silicon oxynitride film.

According to this embodiment, the first layer 34, the second layer 35 and the fluorine terminating layer 33 containing fluorine having the highest electronegativity are provided on the surfaces of the display electrode 4 and the insulator film 31 after formation of the display electrode 4 as hereinabove described, thereby improving effects of the insulator film 31 and the display electrode 4 preventing transmission of moisture and gas. Thus, the substrate 1 can be prevented from discharging moisture and gas toward the liquid crystal layer 3 or the alignment layer 36a also after formation of the display electrode 4. Consequently, the liquid crystal layer 3 and the alignment layer 36a can be effectively prevented from deterioration and defective display resulting from moisture and gas.

According to this embodiment, the first layer 34 mainly composed of indium fluoride ($InF_x$) and the second layer 35 mainly composed of carbon fluoride ($CF_x$) are provided on the surface of the display electrode 4 for stabilizing the surface of the ITO film forming the display electrode 4, thereby suppressing decomposition of the ITO film. Consequently, the alignment layer 36a can be inhibited from deterioration conceivably resulting from decomposition of the ITO film forming the display electrode 4. Thus, an excellent contract can be maintained over a long period.

Figure 1:
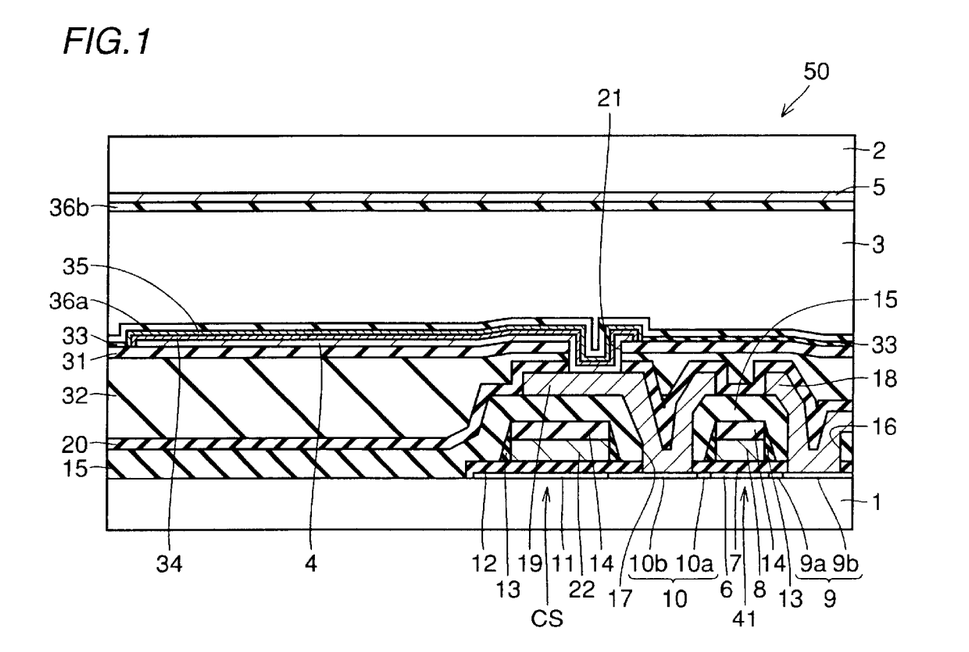
FIG. 1 is a sectional view showing a pixel part of a liquid crystal display unit according to an embodiment of the present invention.

A method of fabricating the liquid crystal display unit according to the embodiment shown in FIG. 1 is now described with reference to FIGS. 2 to 9.

Step 1 (see FIG. 2): First, a non-doped polycrystalline silicon film 6 is formed on the transparent insulating substrate 1 of quartz glass or heat-resistant glass in a thickness of about 50 nm. The polycrystalline silicon film 6 is formed by forming an amorphous silicon film and thereafter polycrystallizing the same, for example. The amorphous silicon film is formed by plasma CVD utilizing decomposition of monosilane or disilane in plasma, for example. The treatment temperature for plasma CVD is about 300° C., and reaction is prompted to form the amorphous silicon film when hydrogen is added. Polycrystallization is performed by a solid state growth method of heat-treating the amorphous silicon film at a temperature of about 600° C. for a long time of about 20 hours thereby polycrystallizing the amorphous film in the solid state and obtaining the polycrystalline film, for example.

Figure 2:
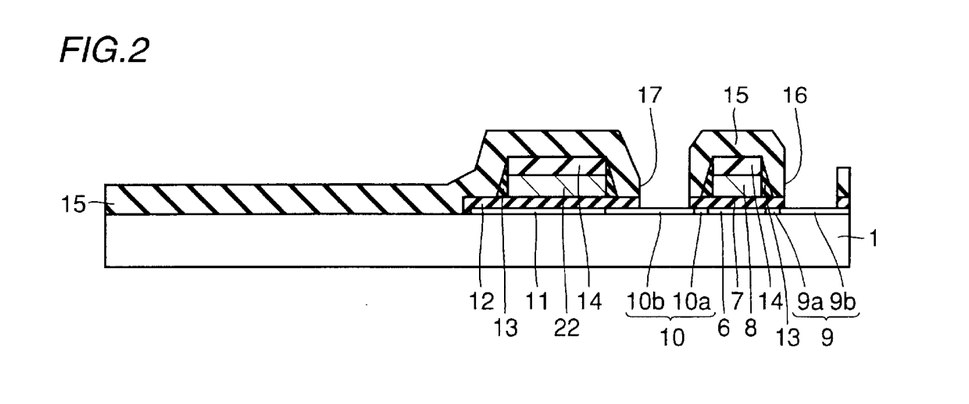
FIGS. 2 to 6 are sectional views for illustrating a fabrication process for the pixel part of the liquid crystal display unit according to the embodiment shown in FIG. 1.

Then, the gate insulator film 7 and the dielectric film 12 are simultaneously formed on the polycrystalline silicon film 6 in thicknesses of about 100 nm respectively. The gate insulator film 7 and the dielectric film 12 of silicon oxide films are formed by thermal decomposition of monosilane or disilane, thermal decomposition of organic oxysilane such as TEOS (tetraethyl orthosilicate) or hydrolysis of silicon halide or the like, for example.

Then, a resist pattern (not shown) is formed only on the gate insulator film 7 excluding the dielectric film 12. Then, the resist pattern is employed as a mask for forming the storage electrode 11 on the polycrystalline silicon film 6. The storage electrode 11 is formed by ion-implanting an impurity (phosphorus or boron) into the polycrystalline silicon film 6 and thereafter performing heat treatment at a high temperature (900° C.) for activating the impurity, for example. In this ion implantation, no impurity is implanted into the polycrystalline silicon film 6 (the source region 10, the drain region 9 and a channel region between the regions 9 and 10) located under the gate insulator film 7 due to the resist pattern formed on the gate insulator film 7 but the polycrystalline silicon film 6 located under the gate insulator film 7 is kept non-doped. Thereafter the resist pattern is removed.

Then, the gate electrode 8 and the counter electrode 22 are simultaneously formed on the gate insulator film 7 and the dielectric film 12 in thicknesses of about 300 nm respectively, and thereafter patterned into desired shapes. Polycrystalline silicon (doped polysilicon) doped with an impurity, metal silicide, polycide, a simple substance of a high melting point metal or another metal is employed as the material for the gate electrode 8 and the counter electrode 22. The gate electrode 8 and the counter electrode 22 are formed by CVD or sputtering.

Then, the insulator film 14 is formed on the gate electrode 8 and the counter electrode 22 by CVD. A silicon oxide film, a silicon nitride film or a silicon oxynitride film is employed as the insulator film 14.

The insulator film 14 and the gate electrode 8 are employed as masks for ion-implanting an impurity into the polycrystalline silicon film 6, thereby forming the low concentration regions 9a and 10a in a self-aligned manner. The method of forming the low concentration regions 9a and 10a is identical to that for the storage electrode 11 except the point that the impurity is implanted in a low concentration.

Then, an insulator film (not shown) is deposited on the overall surface and etched back thereby forming the side wall insulator films 13 on the side walls of the gate electrode 8 and the counter electrode 22. The material for the side wall insulator films 13 is identical to that for the insulator film 14. Then, a resist pattern (not shown) is formed on the side wall insulator films 13 and the insulator film 14. The resist pattern is employed as a mask for forming the high concentration regions 9b and 10b on the polycrystalline silicon film 6. The method of forming the high concentration regions 9b and 10b is identical to that for the storage electrode 11. Thereafter the resist pattern is removed.

Then, the interlayer isolation film 15 is formed on the overall surface of the device. A silicon oxide film, a silicon nitride film or a silicon oxynitride film is employed as the interlayer isolation film 15. Further, the interlayer isolation film 15 is generally formed by CVD. Alternatively, the interlayer isolation film 15 may be formed to have a multilayer structure by combining a plurality of films. For example, the interlayer isolation film 15 may be formed in a structure (NSG/BPSG/NSG) holding a BPSG (boron-doped phosphosilicate glass) film with non-doped silicon oxide films (hereinafter referred to as NSG films). In this case, step coverage of the interlayer isolation film 15 can be improved by performing reflow after forming the BPSG film.

Then, the contact holes 16 and 17 are formed in the interlayer isolation film 15 by photolithography and dry etching (anisotropic etching). The polycrystalline silicon film 6 is exposed to hydrogen plasma, to be subjected to hydrogenation. Hydrogenation is a method of improving field-effect mobility by bonding hydrogen atoms to crystal defect portions of polycrystalline silicon thereby reducing the number of defects and stabilizing the crystal structure. Thus, the element characteristics of the TFT 41 can be improved.

Step 2 (see FIG. 3): An aluminum alloy film (Al-1% Si-0.5% Cu) is deposited on the overall surface of the device including the inner portions of the contact holes 16 and 17. The aluminum alloy film is patterned into a desired shape thereby forming the drain electrode 18 and the source electrode 19. Then, the insulator film 20 is formed on the overall surface of the device. A silicon oxide film, a silicon nitride film or a silicon oxynitride film is employed as the insulator film 20.

Figure 3:
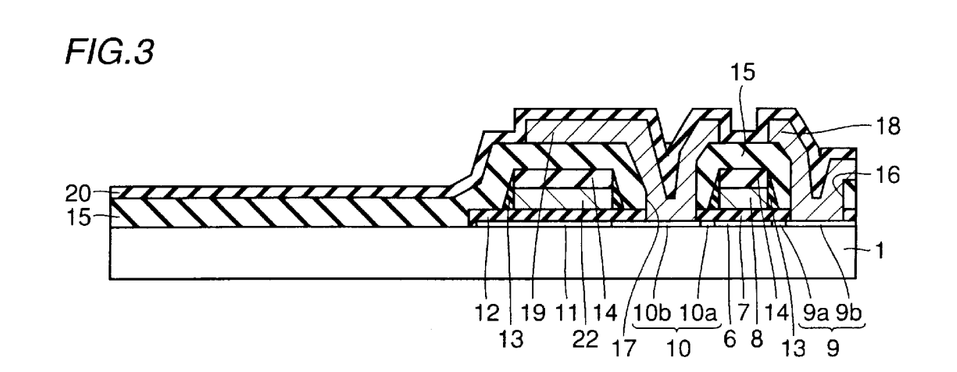

For example, gas employed for forming the silicon oxide film is prepared from monosilane and nitrous oxide ($SiH_4 + N_2O$), monosilane and oxygen ($SiH_4 + O_2$) or TEOS (tetraethoxy silane) and oxygen ($TEOS + O_2$), and the film forming temperature is 300 to 450° C.

Step 3 (see FIG. 4): The SOG 32 serving as the planarization film is formed on the insulator film 20. An organic SOG film is employed as the SOG film 32. The SOG film 32 of an organic SOG film is applied by spin coating. An ethanol solution of a silicon compound is dripped on the transparent insulating substrate 1 while rotating the transparent insulating substrate 1 at a speed of 4800 rpm for 20 seconds, for forming a coating of the solution on the transparent substrate 1. The coating of the ethanol solution is formed thickly on concave portions of steps defined on the transparent insulating substrate 1 and thinly on convex portions, for relaxing the steps. Consequently, the surface of the coating of the ethanol solution is flattened.

Figure 4:
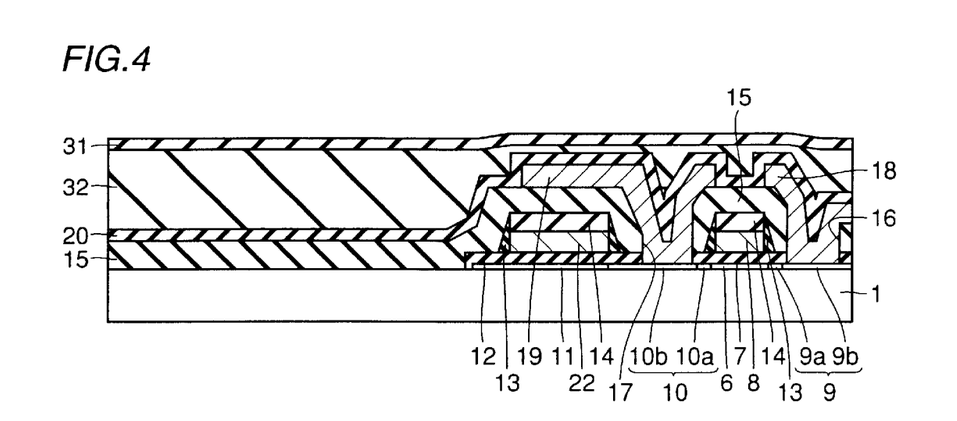
Figure 5:
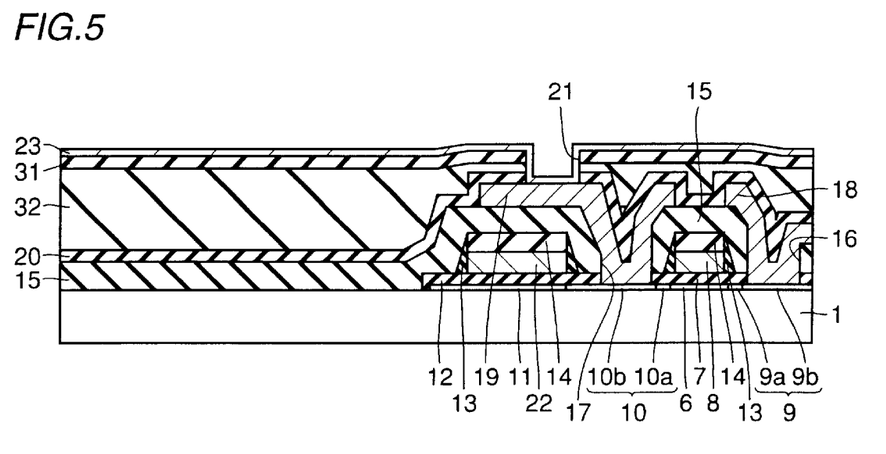

Then, heat treatment is performed in the atmosphere successively at 80° C. for one minute, at 150° C. for one minute and at 200° C. for one minute, for evaporating ethanol and progressing polymerization thereby forming the SOG film 32 of an organic SOG film having a substantially flat surface.

Formation of the coating of the ethanol solution and heat treatment are repeated a plurality of times (three times in this embodiment), and heat treatment is finally performed in a nitrogen atmosphere at 370° C. for 30 minutes, thereby forming the SOG film 32 of an organic SOG film having a desired thickness.

Then, the insulator film 31 is formed on the SOG film 32 by plasma CVD. A silicon oxide film, a silicon nitride film or a silicon oxynitride film is employed as the insulator film 31, similarly to the aforementioned insulator film 20.

Step 4 (see FIG. 5): The contact hole 21 is formed in the insulator film 31, the SOG film 32 and the insulator film 20 by photolithography and dry etching (anisotropic etching). Then, an ITO film 23 is deposited on the overall surface of the device including the inner portion of the contact hole 21.

Step 5 (see FIG. 6): The ITO film 23 is patterned into a desired shape thereby forming the display electrode 4 having a thickness of about 200 nm. This patterning is performed by forming a patterned resist film on the ITO film 23 and thereafter etching the ITO film 23 by reactive ion etching (RIE) employing HBr gas as first etching gas and $Cl_2$ gas as second etching gas, for example. This etching is performed under conditions of a gas flow rate of 30 sccm, a pressure of 2 Pa in an etching chamber, power of 400 W applied from a high-frequency power source and a substrate temperature of 80° C., for example.

Figure 6:
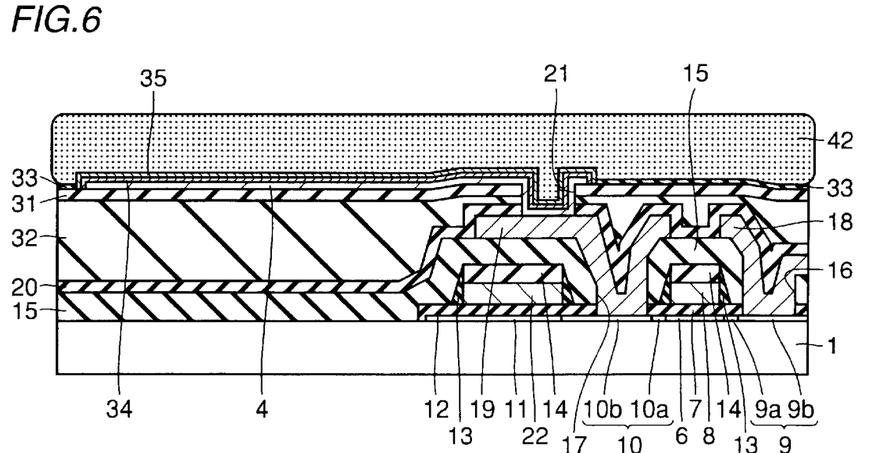

Thereafter the display electrode 4 and the insulator film 31 are exposed to plasma 42 containing fluorine. For example, the display electrode 4 and the insulator film 31 are exposed to plasma prepared under conditions of $CF_4$ and $O_2$ in a mixing ratio of 1:1, a pressure of 20 Pa and RF power of 1 W/cm² in a reactive ion etching apparatus for 5 to 30 seconds.

Thus, fluorine can be introduced into the display electrode 4 and the portion of the insulator film 31 not covered with the display electrode 4. During such introduction of fluorine with the plasma, further, the surface of the insulator film 31 suffering from adhesion of foreign matter and damage caused in the step of forming the display electrode 4 is simultaneously etched by about 10 nm to 50 nm.

On the surface of the insulator film 31 in the portion not covered with the display electrode 4, dangling bonds of Si are terminated by introduced fluorine and weak bonds are replaced with bonds with fluorine, whereby the fluorine terminating layer 33 is formed on this portion. When the insulator film 31 is formed by a silicon oxide film, the fluorine terminating layer 33 is made of a fluoride (Si—F or Si—O—F) of the silicon oxide film, as hereinabove described. When the insulator film 31 is formed by a silicon nitride film, the fluorine terminating layer 33 is made of a fluoride (Si—F or Si—N—F) of the silicon nitride film. When the insulator film 31 is formed by a silicon oxynitride film, the fluorine terminating layer 33 is made of a fluoride (Si—F, Si—O—F or Si—N—F) of the silicon oxynitride film.

The fluorine terminating layer 33 formed after formation of the display electrode 4 reinforces the effect of the insulator film 31 preventing transmission of moisture and gas in the portion not covered with the display electrode 4. Thus, the SOG film 32 can be prevented from discharging gas to the liquid crystal layer 3 and the alignment layer 36a subsequently formed, also after formation of the display electrode 4. Therefore, the SOG film 32 serving as the planarization film can be effectively prevented from discharging gas to the liquid crystal layer 3 and the orientation layer 36a and causing defective display. As hereinabove described, further, the surface of the insulator film 31 is etched simultaneously with introduction of fluorine so that fluorine having high electronegativity can be introduced into the insulator film 31 after removing damage and foreign matter, thereby ensuring the effect of the insulator film 31 preventing transmission of moisture and gas.

The introduced fluorine reacts with indium contained in the display electrode 4 for modifying the surface portion of the display electrode 4 to the first layer 34 mainly composed of indium fluoride ($InF_x$). At the same time, the second layer 35 mainly composed of carbon fluoride ($CF_x$) is formed on the display electrode 4 (the first layer 34). Thus, the first layer 34 mainly composed of indium fluoride ($InF_x$) and the second layer 35 mainly composed of carbon fluoride ($CF_x$) are provided on the surface of the display electrode 4, thereby stabilizing the surface of the ITO film forming the display electrode 4 and suppressing decomposition of the ITO film. Consequently, the alignment layer 36a can be inhibited from deterioration conceivably resulting from decomposition of the ITO film forming the display electrode 4. Thus, an excellent contrast can be maintained over a long period.

The first layer 34 mainly composed of indium fluoride ($InF_x$) and the second layer 35 mainly composed of carbon fluoride ($CF_x$) are now described in detail with reference to FIGS. 7 to 9.

Figure 7:
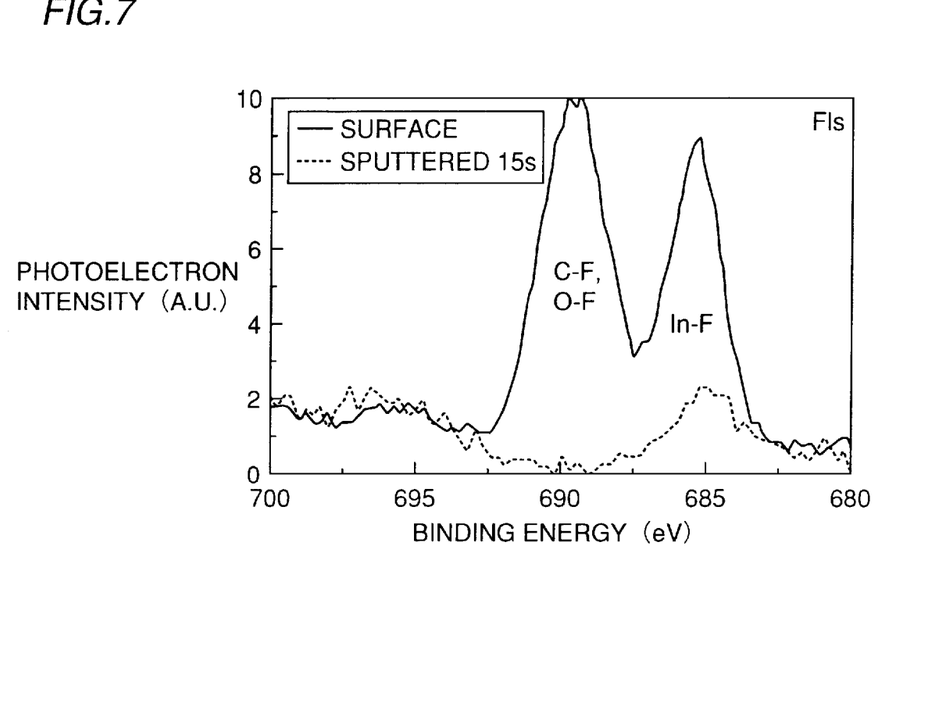
FIGS. 7 and 8 are characteristic diagrams for illustrating effects of the liquid crystal display unit according to the embodiment shown in FIG. 1.

FIG. 7 shows an XPS (X-ray photoelectron spectroscopy) spectrum on the surface of the ITO film exposed to plasma containing fluorine for three minutes with a solid line. Referring to FIG. 7, the horizontal axis shows binding energy, and the vertical axis shows photoelectron intensity. It is clearly understood from FIG. 7 that the surface of the ITO film has peaks of C—F (O—F) and In—F. This indicates that the first layer 34 mainly composed of indium fluoride ($InF_x$) and the second layer 35 mainly composed of carbon fluoride ($CF_x$) are formed on the surface of the ITO film. The second layer 35 mainly composed of carbon fluoride ($CF_x$) also contains oxygen fluoride (O—F) to some extent.

FIG. 7 also shows an XPS spectrum after sputter-etching the surface of the ITO film, exposed to the plasma containing fluorine for three minutes, for 15 seconds. It is clearly understood from FIG. 7 that the surface of the ITO film substantially loses the peaks of C—F (O—F) and In—F due to the sputter-etching of 15 seconds. The thickness of a potion scraped by the sputter etching performed for 15 seconds is about 5 nm, and hence the total thickness of the first layer 34 mainly composed of indium fluoride ($InF_X$) and the second layer 35 mainly composed of carbon fluoride ($CF_X$) is about 5 nm. It is also understood that the peak of C—F (O—F) completely disappears due to the sputter etching of 15 seconds while the peak of In—F slightly remains. Thus, the first layer 34 mainly composed of indium fluoride ($InF_X$) is conceivably formed below the second layer 35 mainly composed of carbon fluoride ($CF_X$).

Figure 8:
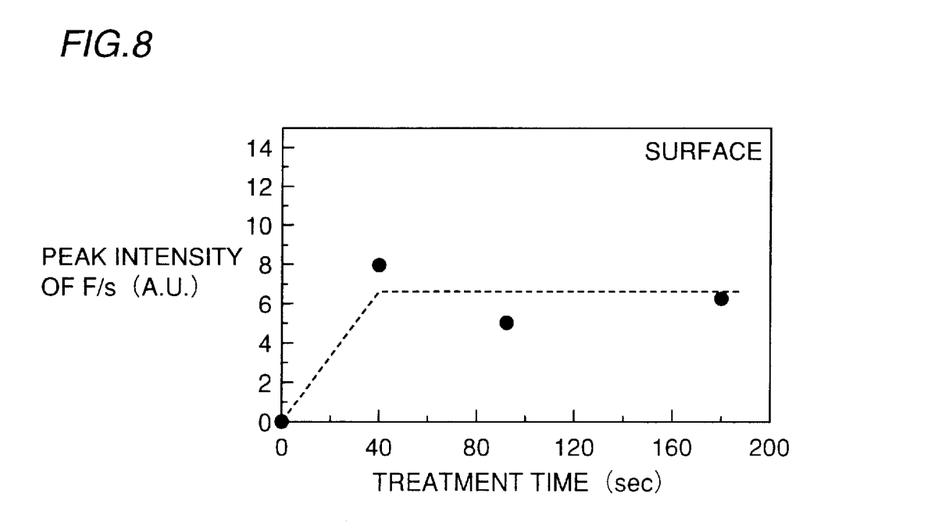

FIG. 8 shows the relation between the time of the treatment with the plasma containing fluorine and peak intensity. As understood from FIG. 8, the peak intensity remains substantially unchanged when the time of the treatment with the plasma containing fluorine exceed 40 seconds. This indicates that the thicknesses of the first layer 34 mainly composed of indium fluoride ($InF_X$) and the second layer 35 mainly composed of carbon fluoride ($CF_X$) are not increased but remain substantially constant when the treatment time with the plasma containing fluorine exceeds 40 seconds.

According to this embodiment, as hereinabove described, the first layer 34 mainly composed of indium fluoride ($InF_X$) and the second layer 35 mainly composed of carbon fluoride ($CF_X$) are formed on the surface of the display electrode 4, thereby suppressing decomposition of the ITO film forming the display electrode 4 and inhibiting the alignment layer 36a from deterioration conceivably resulting from decomposition of the ITO film forming the display electrode 4.

Figure 9:
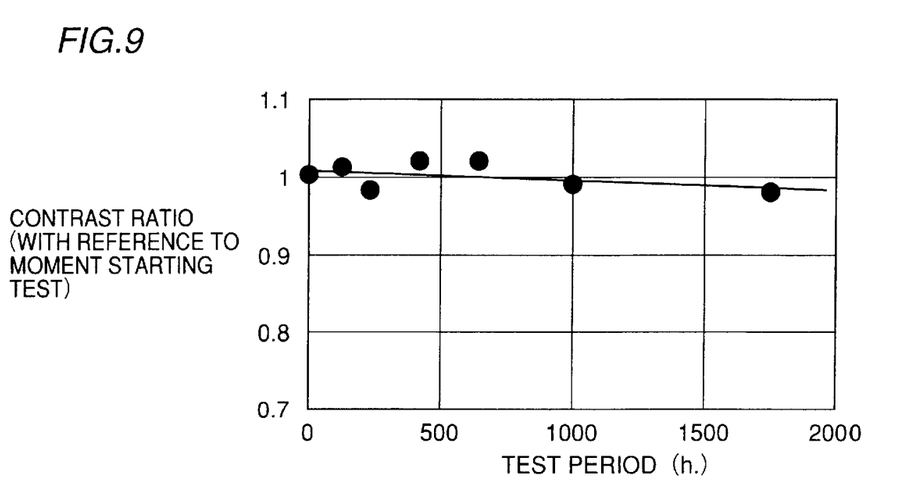
FIG. 9 illustrates the results of an aging test on the liquid crystal display unit according to the embodiment shown in FIG. 1.

FIG. 9 shows contrast ratios at the time of performing an aging test on the liquid crystal display unit according to this embodiment. As compared with the contrast ratios in the conventional liquid crystal display unit shown in FIG. 11, it is understood that the alignment layer 36a is inhibited from time deterioration over a long period and an excellent contrast can be attained over a long period as a result in the liquid crystal display unit according to this embodiment.

Step 6 (see FIG. 1): Then, a high-molecular organic material (polyimide in this embodiment) is applied to the overall surfaces of the transparent insulating substrate 1 formed with the TFT 41 and the auxiliary capacitor CS through the aforementioned fabrication steps and the transparent insulating substrate 2 formed with the common electrode 5 on its surface and hardened by heat treatment, thereby forming the alignment layers 36a and 36b.

The surfaces of the alignment layers 36a and 36b are oriented for orienting liquid crystal molecules in a prescribed direction. This orientation is performed by any of the following methods:

Rubbing: The surfaces of the alignment layers 36a and 36b are mechanically rubbed with rubbing cloth of nylon or rayon in a constant direction.

Ultraviolet Irradiation: The surfaces of the alignment layers 36a and 36b are irradiated with polarized ultraviolet rays.

Groove Shape Transfer: Acrylic transfer plates having small irregularities on the surfaces thereof are pressed against the surfaces of the alignment layers 36a and 36b.

Finally, the transparent insulating substrate 1 formed with the alignment layer 36a and the transparent insulating substrate 2 formed with the alignment layer 36b are opposed to each other and liquid crystals are filled therebetween for forming the liquid crystal layer 3, thereby completing the pixel part 50 of the liquid crystal display unit according to this embodiment shown in FIG. 1.

Although the present invention has been described and illustrated in detail, it is clearly understood that the same is by way of illustration and example only and is not to be taken by way of limitation, the spirit and scope of the present invention being limited only by the terms of the appended claims.

(1) While fluorine is introduced into both of the display electrode 4 and the portion of the insulator film 31 not covered with the display electrode 4 in the aforementioned embodiment, for example, the present invention is not restricted to this but fluorine may be introduced only into the portion of the insulator film 31 not covered with the display electrode 4. Also in this case, the SOG film 32 can be prevented from discharging gas toward the liquid crystal layer 3 and the alignment layer 36a. Each of the insulator film 31 and the display electrode 4 has an effect of preventing transmission of gas also when containing no fluorine, although the effect is insufficient. In the portion covered with the display electrode 4, therefore, the effects of the insulator film 31 and the display electrode 4 preventing transmission of gas are added for preventing the SOG film 32 from discharging gas toward the liquid crystal layer 3 and the alignment layer 36a.

(2) In the step 5, the portions exposed on the surfaces of the display electrode 4 and the insulator film 31 may be exposed to radicals containing fluorine in place of the plasma 42 containing fluorine. When employing radicals, the quantity of the introduced fluorine and the speed of introduction thereof can be effectively increased similarly to the case of employing plasma. In this case, $CF_4$, $CHF_3$ or $SF_6$ gas or a gas mixture of such gas and Ar or $N_2$ is converted to radicals in a plasma apparatus such as a remote plasma etching apparatus, for example, capable of separating a substrate from a plasma part and transporting radicals to the substrate. For example, plasma is formed with gas containing $CF_4$ and $O_2$ in the mixing ratio of 5:2, a pressure of 20 Pa and a microwave of 600 W for guiding generated radicals to a substrate set on a discharge direction thereby exposing the aforementioned portions to the radicals containing fluorine.

(3) In the step 5, the portions exposed on the surfaces of the display electrode 4 and the insulator film 31 may be exposed to gas containing fluorine in place of the plasma 42 containing fluorine. For example, hydrogen fluoride gas can be employed as the gas containing fluorine.

(4) In the step 5, the portions exposed on the surfaces of the display electrode 4 and the insulator film 31 may be dipped in liquid containing fluorine, in place of being exposed to the plasma 42 containing fluorine. For example, an aqueous solution of hydrogen fluoride or an aqueous solution of ammonium fluoride can be employed as the liquid containing fluorine.

When employing the gas or liquid containing fluorine as described above, fluorine can be introduced through a low-priced apparatus and hence the fabrication cost can be advantageously reduced.

(5) In the step 5, ions containing fluorine may be implanted into the portions exposed on the surfaces of the display electrode 4 and the insulator film 31, in place of exposing these portions to the plasma 42 containing fluorine. F ions, Si ions or B ions prepared from material gas of $SiF_4$ gas or $BF_3$ gas can be employed as the ions containing fluorine, for example. This ion implantation is performed under conditions of 5 to 30 keV and $1 \times 10^{15}$ cm$^{-2}$ to $5 \times 10$ cm$^{-2}$, for example. When employing ion implantation, the quantity of the introduced fluorine and the depth of introduction thereof can be readily and precisely controlled.

In the aforementioned method employing the gas or liquid containing fluorine or implanting ions containing fluorine, only the first layer 34 mainly composed of indium fluoride is formed on the surface of the display electrode 4 with no formation of the second layer 35 mainly composed of carbon fluoride. Also in this case, the first layer 34 mainly composed of indium fluoride can suppress decomposition of the ITO film forming the display electrode 4 and improve the effect of the display electrode 4 preventing transmission of moisture and gas.

(6) While the surface of the insulator film 31 is exposed to the plasma 42 containing fluorine under the conditions for etching the surface by 10 nm to 50 nm in the step 5, the surface of the insulator film 31 may not be etched when the same has neither damage nor foreign matter. In this case, the surface of the insulator film 31 is exposed to plasma formed under conditions of gas containing $CF_4$ and $O_2$ in a mixing ratio of 1:1, a pressure of 40 Pa and RF power of 0.5 W/Cm² in a plasma etching apparatus, for example.

(7) While an organic SOG film is employed as the SOG film 32 in the aforementioned embodiment, an inorganic SOG film or another coating insulator film is also employable. A coating insulator film containing organic groups is desirable due to an advantage hardly causing cracking.

(8) The insulator film 31 formed on the SOG film 32 in the aforementioned embodiment may be omitted and fluorine may be introduced into the surface of the SOG film 32. In this case, the fluorine terminating layer 33 is formed on the surface of the SOG film 32, for reinforcing the effect of preventing transmission of gas similarly to the aforementioned embodiment.

(9) While fluorine having the highest electronegativity is introduced into the insulator film 31 in the aforementioned embodiment, another impurity element having high electronegativity may be introduced in place of fluorine. Examples of the other impurity element having high electronegativity are chlorine, bromine, carbon, sulfur, iodine, serene, hydrogen, phosphorus, tellurium, boron and arsenic. In this case, the impurity element having high electronegativity forms a terminating layer in place of fluorine, thereby reinforcing the effect of the insulator film 31 preventing transmission of gas and preventing the SOG film 32 from discharging gas toward the liquid crystal layer 3 and the alignment layer 36a.

What is claimed is:

1. A display unit comprising:
   an insulator film formed on a substrate;
   a display electrode formed on said insulator film; and
   an impurity-introduced layer, formed on an upper surface of said display electrode and on an upper surface of said insulator film, containing an impurity element having high electronegativity.
2. The display unit according to claim 1, wherein said insulator film includes an insulator film containing an organic component.
3. The display unit according to claim 1, wherein said impurity element having high electronegativity includes fluorine.
4. The display unit according to claim 3, wherein said impurity-introduced layer is formed on the surface of said insulator film, and includes any of a fluoride layer of a silicon oxide film, a fluoride layer of a silicon nitride film and a fluoride layer of a silicon oxynitride film.
5. The display unit according to claim 3, wherein said impurity-introduced layer includes a first layer, formed on the surface of said display electrode, mainly composed of indium fluoride.
6. A display unit comprising:
   an insulator film formed on a substrate;
   a display electrode formed on said insulator film; and
   an impurity-introduced layer, formed on the surface of said display electrode and the surface of said insulator film, comprising a first layer, formed on the surface of said display electrode, mainly composed of indium fluoride, and a second layer, formed on said first layer, mainly composed of carbon fluoride.
7. A display unit comprising:
   an insulator film formed on a substrate;
   a display electrode formed on said insulator film; and
   a first layer, formed on an upper surface of said display electrode, mainly composed on indium fluoride.
8. A display unit comprising:
   an insulator film formed on a substrate;
   a display electrode formed on said insulator film;
   a first layer, formed on the surface of said display electrode, mainly composed of indium fluoride, and a second layer, formed on said first layer, mainly composed of carbon fluoride.
9. A display unit comprising:
   an insulator film formed on a substrate;
   a display electrode formed on said insulator film; and
   an impurity-introduced layer, formed on a surface of said display electrode which is not opposite to the substrate and on a surface of said insulator film which is not opposite to the substrate, containing an impurity element having high electronegativity.
10. The display unit according to claim 9, wherein said insulator film includes an insulator film containing an organic component.
11. The display unit according to claim 9, wherein said impurity element having high electronegativity includes fluorine.
12. The display unit according to claim 11, wherein, said impurity-introduced layer is formed on the surface of said insulator film, and includes any of a fluoride layer of a silicon oxide film, a fluoride layer of a silicon nitride film and a fluoride layer of a silicon oxynitride film.
13. The display unit according to claim 11, wherein said impurity-introduced layer includes a first layer, formed on the surface of said display electrode, mainly composed of indium fluoride.
14. A display unit comprising:
    an insulator film formed on a substrate;
    a display electrode formed on said insulator film; and
    a first layer, formed on a surface of said display electrode which is not opposite to the substrate, mainly composed of indium fluoride.
15. The display unit according to claim 14, wherein said insulator film includes an insulator film containing an organic component.
16. The display unit according to claim 14, wherein first layer is formed on the surface of said insulator film, and includes any of a fluoride layer of a silicon oxide film, a fluoride layer of a silicon nitride film and a fluoride layer of a silicon oxynitride film.

* * * * *